US011385549B2

(12) United States Patent
Taguchi (10) Patent No.: US 11,385,549 B2
(45) Date of Patent: Jul. 12, 2022

(54) MANAGEMENT METHOD OF MANAGING PROCESSING APPARATUS BY SETTING OFFSET TO REDUCE VARIANCE, MANAGEMENT APPARATUS, COMPUTER READABLE MEDIUM, AND ARTICLE MANUFACTURING METHOD

(71) Applicant: CANON KABUSHIKI KAISHA, Tokyo (JP)

(72) Inventor: Tetsuya Taguchi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 241 days.

(21) Appl. No.: 16/194,933

(22) Filed: Nov. 19, 2018

(65) Prior Publication Data
US 2019/0163073 A1 May 30, 2019

(30) Foreign Application Priority Data
Nov. 24, 2017 (JP) .............................. JP2017-226035

(51) Int. Cl.
*G05B 19/41* (2006.01)
*G03F 7/20* (2006.01)
*G05B 19/4155* (2006.01)
*G03F 7/00* (2006.01)

(52) U.S. Cl.
CPC ........ *G03F 7/70516* (2013.01); *G03F 7/0002* (2013.01); *G03F 7/70525* (2013.01); *G03F 7/70975* (2013.01); *G05B 19/4155* (2013.01); *G05B 2219/31372* (2013.01)

(58) Field of Classification Search
None
See application file for complete search history.

(56) References Cited

U.S. PATENT DOCUMENTS 5,424,552 A * 6/1995 Tsuji ................... G03F 7/70241
250/548
5,974,233 A * 10/1999 Nishiyama ............. G06K 15/00
358/1.13
5,986,263 A * 11/1999 Hiroi ....................... H01J 37/28
250/307
(Continued)

FOREIGN PATENT DOCUMENTS

JP     2001102282 A    4/2001
JP     2005244519 A    9/2005
(Continued)

OTHER PUBLICATIONS

Busch et al., "Improving lithographic performance for 32 nm", 2010, SPIE Advanced Lithography. (Year: 2010).*
(Continued)

*Primary Examiner* — Mohammad Ali
*Assistant Examiner* — Kelvin Booker
(74) *Attorney, Agent, or Firm* — Rossi, Kimms & McDowell LLP (57) ABSTRACT

A management method of managing a processing apparatus that performs processing of a member, includes setting, in a case where adjustment of the processing apparatus is performed, an offset value to control the processing apparatus such that variance between results of processing by the processing apparatus before and after the adjustment is reduced.

20 Claims, 9 Drawing Sheets

(56) References Cited

U.S. PATENT DOCUMENTS

| | | | | |
|---|---|---|---|---|
| 6,232,248 B1* | 5/2001 | Shinriki | C23C 16/405 | 438/785 |
| 6,236,447 B1* | 5/2001 | Yamada | G03F 9/7034 | 355/53 |
| 6,308,554 B1* | 10/2001 | Mattes | G01P 21/00 | 73/1.37 |
| 6,368,883 B1* | 4/2002 | Bode | G03F 7/70525 | 257/E21.528 |
| 6,376,139 B1* | 4/2002 | Fujisawa | G03F 7/70625 | 430/30 |
| 6,376,848 B1* | 4/2002 | Minami | B82Y 10/00 | 250/398 |
| 6,826,743 B2* | 11/2004 | Park | G03F 7/70633 | 430/30 |
| 6,970,244 B2* | 11/2005 | Takeishi | G03F 7/70358 | 356/399 |
| 7,006,690 B1* | 2/2006 | Imura | G01J 3/10 | 382/167 |
| 7,829,249 B2* | 11/2010 | Van De Kerkhof | G03B 27/42 | 430/30 |
| 8,077,378 B1* | 12/2011 | Bass | G09G 3/20 | 359/291 |
| 8,100,552 B2* | 1/2012 | Spero | F21S 41/663 | 362/231 |
| 8,237,913 B2* | 8/2012 | Kazinczi | G03F 7/70891 | 355/53 |
| 8,793,099 B2* | 7/2014 | Menchtchikov | G03F 7/70516 | 702/182 |
| 8,937,707 B2* | 1/2015 | Jansen | G03F 7/70516 | 355/55 |
| 9,304,411 B2* | 4/2016 | Baselmans | G03F 7/706 | |
| 10,078,272 B2* | 9/2018 | Downes | G03F 7/706 | |
| 10,451,977 B2* | 10/2019 | Kant | G03F 7/706 | |
| 10,948,832 B2* | 3/2021 | Kant | G03F 7/705 | |
| 2002/0105649 A1* | 8/2002 | Smith | G03F 7/70591 | 356/401 |
| 2003/0025890 A1* | 2/2003 | Nishinaga | G03F 7/70191 | 355/53 |
| 2003/0035090 A1* | 2/2003 | Imai | G03F 7/70258 | 355/53 |
| 2004/0051792 A1* | 3/2004 | Oda | H04N 5/2355 | 348/229.1 |
| 2004/0070771 A1* | 4/2004 | Ausschnitt | G03F 7/70641 | 356/625 |
| 2004/0105691 A1* | 6/2004 | Hama | G03G 15/5058 | 399/49 |
| 2004/0179190 A1* | 9/2004 | Miyashita | G03F 7/706 | 356/124 |
| 2005/0037266 A1* | 2/2005 | Tsai | G03F 7/70558 | 430/5 |
| 2005/0088636 A1* | 4/2005 | Kurosawa | G03F 9/7026 | 355/53 |
| 2005/0169506 A1* | 8/2005 | Fenrich | G06K 9/00046 | 382/127 |
| 2006/0008716 A1* | 1/2006 | Jeunink | G03F 7/706 | 430/30 |
| 2006/0114437 A1* | 6/2006 | Akhssay | G03F 7/705 | 355/55 |
| 2006/0193532 A1* | 8/2006 | Roberts | G03F 7/70641 | 382/255 |
| 2007/0050749 A1* | 3/2007 | Ye | G03F 7/70641 | 430/30 |
| 2007/0072091 A1* | 3/2007 | Smith | G03F 7/70633 | 430/5 |
| 2007/0105244 A1* | 5/2007 | Okita | G03F 7/70616 | 257/48 |
| 2007/0219736 A1* | 9/2007 | Okita | G03F 7/70525 | 702/81 |
| 2007/0252966 A1* | 11/2007 | Shirata | H01L 21/67225 | 355/67 |
| 2007/0263191 A1* | 11/2007 | Shibazaki | G03F 9/7084 | 355/53 |
| 2008/0252870 A1* | 10/2008 | Jeunink | G03F 7/70891 | 355/53 |
| 2008/0294280 A1* | 11/2008 | Okita | G03F 7/70625 | 700/108 |
| 2008/0316446 A1* | 12/2008 | Shibazaki | G03F 7/70725 | 355/53 |
| 2010/0086672 A1* | 4/2010 | Von Drasek | B31F 1/14 | 427/9 |
| 2014/0168293 A1* | 6/2014 | Moreau | G06F 3/1201 | 347/2 |
| 2014/0168302 A1* | 6/2014 | Ngo | B41J 2/155 | 347/14 |
| 2014/0168303 A1* | 6/2014 | Moreau | B41J 2/155 | 347/14 |
| 2014/0168319 A1* | 6/2014 | Moreau | B41J 2/04505 | 347/49 |
| 2014/0168620 A1* | 6/2014 | Schmitt-Weaver | G03F 7/70516 | 355/52 |
| 2014/0170302 A1* | 6/2014 | Von Drasek | D21G 9/0036 | 427/9 |
| 2015/0025668 A1* | 1/2015 | Ye | B29C 64/393 | 700/108 |
| 2015/0042969 A1* | 2/2015 | Morikuni | G03F 9/7034 | 355/55 |
| 2016/0239013 A1* | 8/2016 | Troy | G05B 15/02 | |
| 2017/0269483 A1* | 9/2017 | Tinnemans | G03F 7/70433 | |
| 2019/0163073 A1* | 5/2019 | Taguchi | G05B 19/4155 | |

FOREIGN PATENT DOCUMENTS

| | | |
|---|---|---|
| JP | 2010128301 A | 6/2010 |
| JP | 2014146636 A | 8/2014 |

OTHER PUBLICATIONS

Matsuyama, T., "Exposure tool control for advanced semiconductor lithography", Adv. Opt. Techn. 2015; 4(4): 285-296. (Year: 2015).*

Office Action issued in Korean Appln. No. 10-2018-0146150 dated Nov. 2, 2021.

Office Action issued in Japanese Appln. No. 2017-226035 dated Sep. 27, 2021.

* cited by examiner

| | OUTPUT VALUE [bit] |
|---|---|
| FIRST ILLUMINANCE MONITOR | 10000 |
| SECOND ILLUMINANCE MONITOR | 10000 |

CONVERSION FACTOR =1

FIG. 8B

| | OUTPUT VALUE [bit] |
|---|---|
| FIRST ILLUMINANCE MONITOR | 10000 |
| SECOND ILLUMINANCE MONITOR | 9500 |

CONVERSION FACTOR =0.95

FIG. 9

MANAGEMENT METHOD OF MANAGING PROCESSING APPARATUS BY SETTING OFFSET TO REDUCE VARIANCE, MANAGEMENT APPARATUS, COMPUTER READABLE MEDIUM, AND ARTICLE MANUFACTURING METHOD

BACKGROUND OF THE INVENTION

Field of the Invention

The present invention relates to a management method of managing a processing apparatus, a management apparatus, a computer readable medium, and an article manufacturing method.

Description of the Related Art

Examples of a processing apparatus designed to perform processing of a member are pattern forming apparatuses such as an exposure apparatus and an imprint apparatus, and deposition apparatuses such as a CVD apparatus and a PVD apparatus. Parameter values can be set to control the state of such a processing apparatus. For example, in the exposure apparatus, parameter values regarding the exposure amount, focus, and alignment can be set to obtain a target exposure result (processing result). An offset value can be decided to, for example, evaluate a processing result and feed back the evaluation result to the processing apparatus.

Japanese Patent Laid-Open No. 2001-102282 describes a technique of measuring the result of exposure of a wafer by an exposure apparatus, deciding a shift amount of the focus, and feeding back the shift amount to a focus setting value of the exposure apparatus.

Such feedback is a technique advantageous to keeping the characteristic or quality of results of processing by a processing apparatus within an allowable range regardless of aging of the state of the processing apparatus. However, when maintenance such as replacement of a component of the processing apparatus, or calibration of a function of the processing apparatus is done, the state of the processing apparatus can vary greatly. To perform feedback, it is necessary to tentatively process a member by the processing apparatus immediately after maintenance or calibration and evaluate the result. Without such feedback after maintenance or calibration, the results of processing by the processing apparatus can vary abruptly before and after maintenance or calibration.

SUMMARY OF THE INVENTION

The present invention provides a technique advantageous to easily suppressing abrupt variance between the results of processing by a processing apparatus that is caused by adjustment of the processing apparatus.

One of aspects of the present invention provides a management method of managing a processing apparatus that performs processing of a member, comprising: setting, in a case where adjustment of the processing apparatus is performed, an offset value to control the processing apparatus such that variance between results of processing by the processing apparatus before and after the adjustment is reduced.

Further features of the present invention will become apparent from the following description of exemplary embodiments with reference to the attached drawings.

DESCRIPTION OF THE EMBODIMENTS

The present invention will be described below through its exemplary embodiment with reference to the accompanying drawings.

In most part of this specification, an exposure apparatus serving as a pattern forming apparatus will be described in detail as an example of a processing apparatus designed to perform processing of a member. However, the concept of a processing apparatus designed to perform processing of a member can include deposition apparatuses such as a CVD (Chemical Vapor Deposition) apparatus and a PVD (Physical Vapor Deposition) apparatus, an etching apparatus, and a coating and developing apparatus in addition to pattern forming apparatuses such as an exposure apparatus and an imprint apparatus. For example, when adjustment such as replacement of a substrate chuck is performed in the imprint apparatus, the results of processing by the imprint apparatus can vary before and after the adjustment in general. When adjustment such as replacement of an electrode is performed in the deposition apparatus and the etching apparatus, the processing results can vary before and after the adjustment in general. When adjustment such as replacement of a component is performed in the coating and developing apparatus, the processing results can vary before and after the adjustment in general.

In a management method according to the present invention, an offset value to control a processing apparatus can be set so that, in a case where adjustment of the processing apparatus is performed, variance of the results between processing by the processing apparatus before and after the adjustment is reduced.

Figure 1:
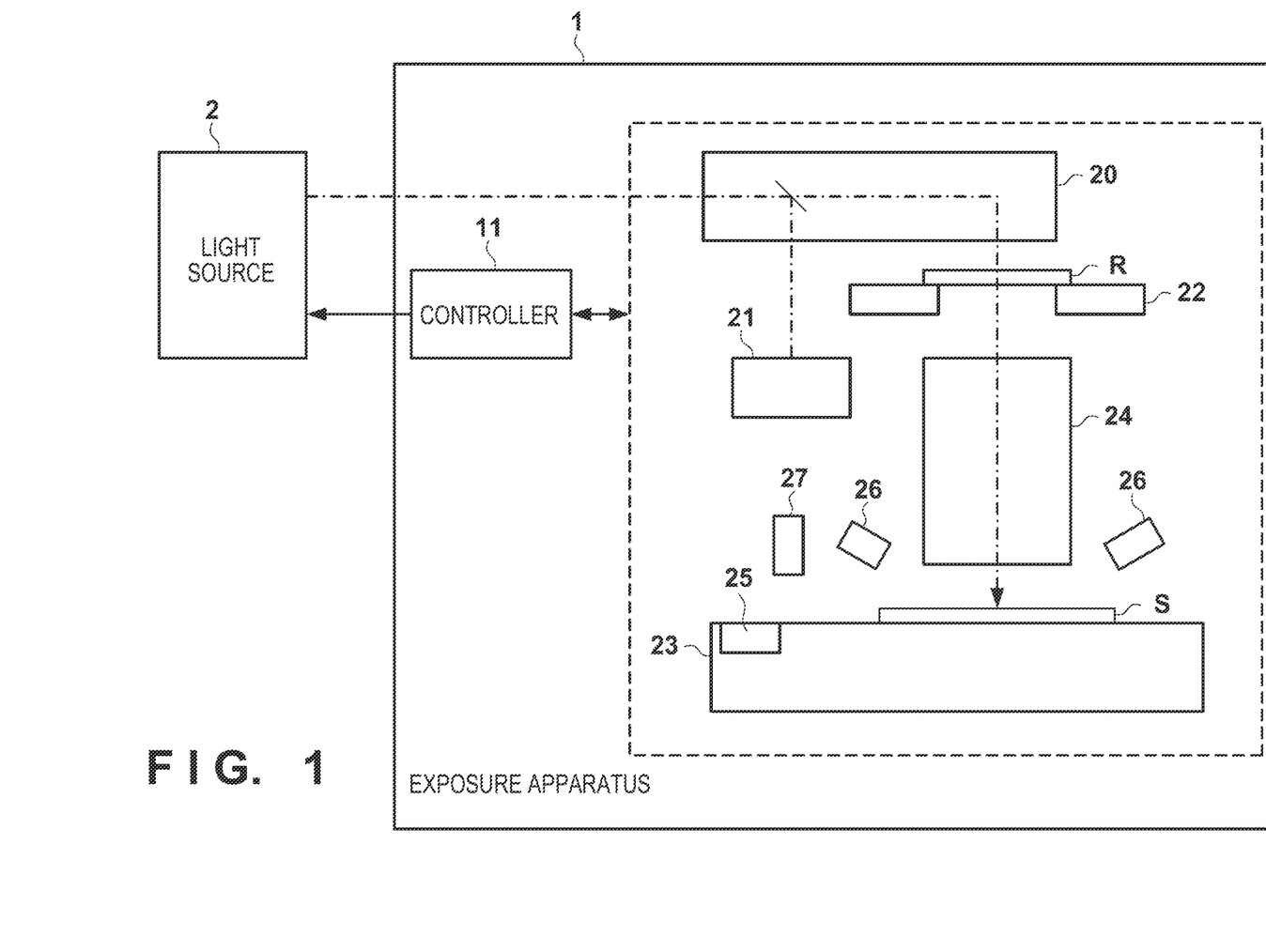
FIG. 1 is a view schematically showing the arrangement of an exposure apparatus according to an embodiment of the present invention.

An example of applying the present invention to an exposure apparatus serving as a pattern forming apparatus will be explained below to provide a more concrete example. FIG. 1 schematically shows the arrangement of an exposure apparatus 1 according to an embodiment of the present invention. The exposure apparatus 1 can include, for example, an illumination system 20, an original stage 22, a projection system 24, a substrate stage 23, a first illuminance monitor 21, a second illuminance monitor 25, focus sensors 26, an alignment sensor 27, and a controller 11. A light source 2 may be a component of the exposure apparatus 1 or be grasped as an external apparatus of the exposure apparatus 1.

The illumination system 20 illuminates an original (reticle) held by the original stage 22 in a set illumination mode (for example, circular illumination, annular illumination, dipole illumination, or quadrupole illumination) using light provided from the light source 2. The original stage 22 holds an original R and can be driven by a driving mechanism (not shown). The projection system 24 projects the pattern of the original R to a substrate S held by the substrate stage 23. The substrate stage 23 holds the substrate S and is driven by a driving mechanism (not shown).

The first illuminance monitor 21 is configured to detect, for example, the illuminance of light split from the optical path of the illumination system 20. The second illuminance monitor 25 is mounted on, for example, the substrate stage 23 and configured to detect the illuminance of light on the image plane (substrate plane) of the projection system 24. The focus sensors 26 detect the level of the surface of the substrate S. The level of the substrate S can be adjusted based on outputs from the focus sensors 26 so that the level of the surface of the substrate S coincides with the best focus position of the projection system 24. The alignment sensor 27 can be configured to detect the position of a mark on the substrate S.

The controller 11 can be configured to control the illumination system 20, the original stage 22, the projection system 24, the substrate stage 23, the first illuminance monitor 21, the second illuminance monitor 25, the focus sensors 26, and the alignment sensor 27. The controller 11 can be constituted by, for example, a PLD (Programmable Logic Device) such as a FPGA (Field Programmable Gate Array), an ASIC (Application Specific Integrated Circuit), a general-purpose computer in which a program is installed, or a combination of all or some of them. The program can be stored in, for example, a memory medium and carried. Alternatively, the program can be transmitted via a communication line. The controller 11 can also function as a management apparatus configured to manage the exposure apparatus 1.

Figure 2:
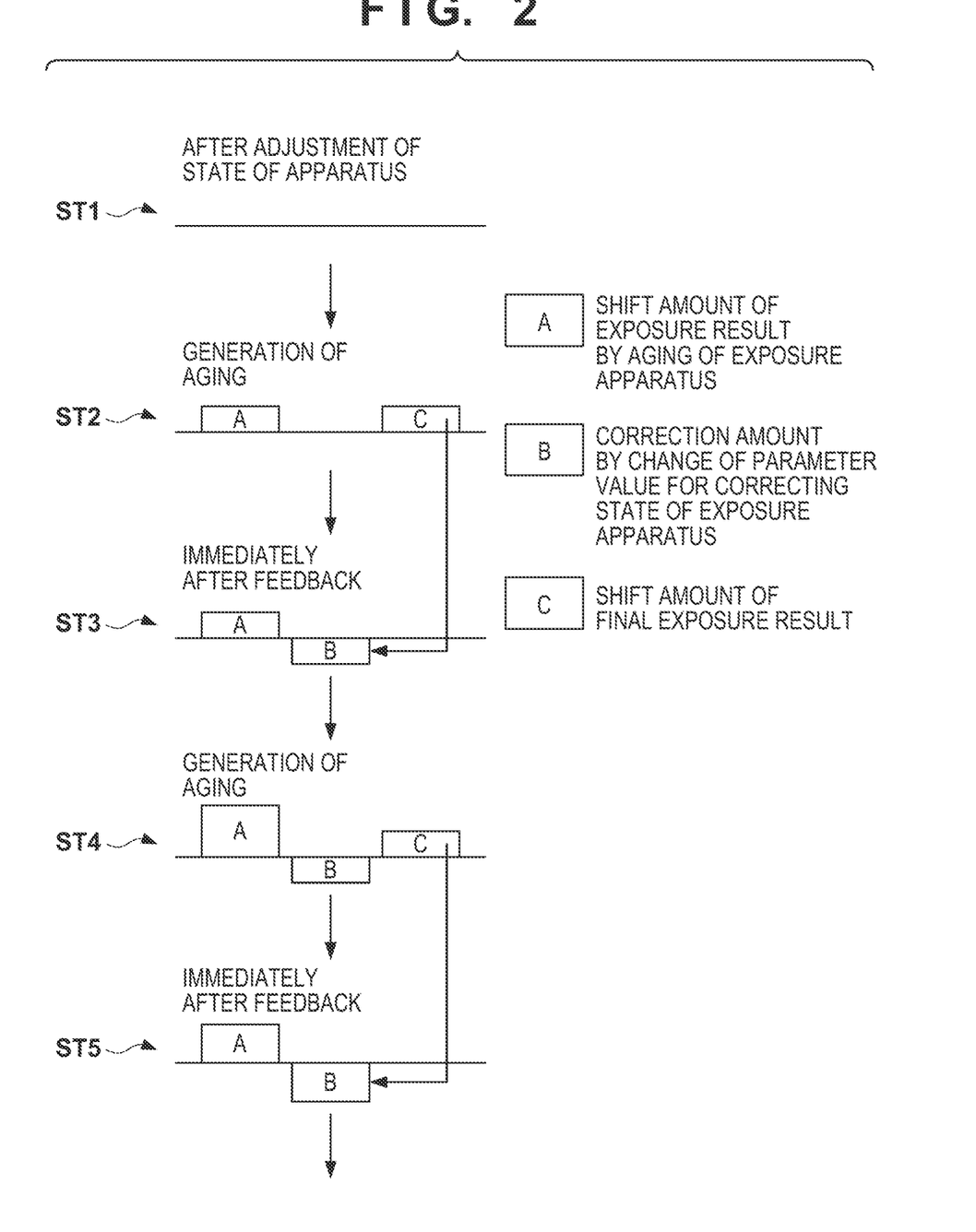
FIG. 2 is a view schematically showing aging of the state of the exposure apparatus and feedback to reduce the influence of aging.

FIG. 2 schematically shows aging of the state of the exposure apparatus 1 and feedback to reduce the influence of aging. In FIG. 2, A schematically represents the shift amount (shift amount from a target) of the result of exposure by the exposure apparatus 1 that is generated owing to aging of the state of the exposure apparatus 1. The state of the exposure apparatus 1 can include, for example, the light transmittance of the illumination system 20 and/or the projection system 24, the state of the light source 2, the positioning error of the substrate stage 23, the imaging performance of the projection system 24, the values of set coefficients, and the like. The shift amount of the exposure result can appear as, for example, a shift amount from the target of a pattern width (line width).

In FIG. 2, B schematically represents a correction amount (correction amount for canceling the shift amount of the exposure result) by change of a parameter value for correcting the state of the exposure apparatus 1, in order to obtain a satisfactory exposure result. The parameter value can be, for example, a numerical value that influences at least either of the exposure amount and the defocus amount. In FIG. 2, C schematically represents a shift amount in a final exposure result that is obtained as the sum of A and B. In FIG. 2, a horizontal line indicates a level at which the shift amount is 0. An upper side from the horizontal line represents a positive shift amount, and a lower side from the horizontal line represents a negative shift amount.

Referring to FIG. 2, in a state ST1, the exposure apparatus 1 is adjusted to an optimal state and the shift amount A of the exposure result from the target is 0. In this example, the correction amount B in the state ST1 is 0. In a state ST2, the shift amount A of the exposure result is generated owing to aging. In the state ST2, the correction amount B is 0 and the shift amount C of the final exposure result is equal to the shift amount A of the exposure result that is generated owing to aging.

In a state ST3, the shift amount B is set to cancel the shift amount C of the final exposure result in the state ST2. In this state, the shift amount C of the final exposure result in the state ST2 is fed back to the correction amount B.

In a state ST4, the aging of the exposure apparatus 1 advances and the shift amount A of the exposure result becomes larger than the shift amount A of the exposure result in the state ST3. The state ST4 can be regarded as a state in which the feedback of the shift amount C of the exposure result with respect to the correction amount B lags or a state in which no feedback has been done.

In a state ST5, the correction amount B is set to cancel the shift amount C of the final exposure result in the state ST4. In this state, the shift amount C of the final exposure result in the state ST4 is fed back to the correction amount B.

Figure 3:
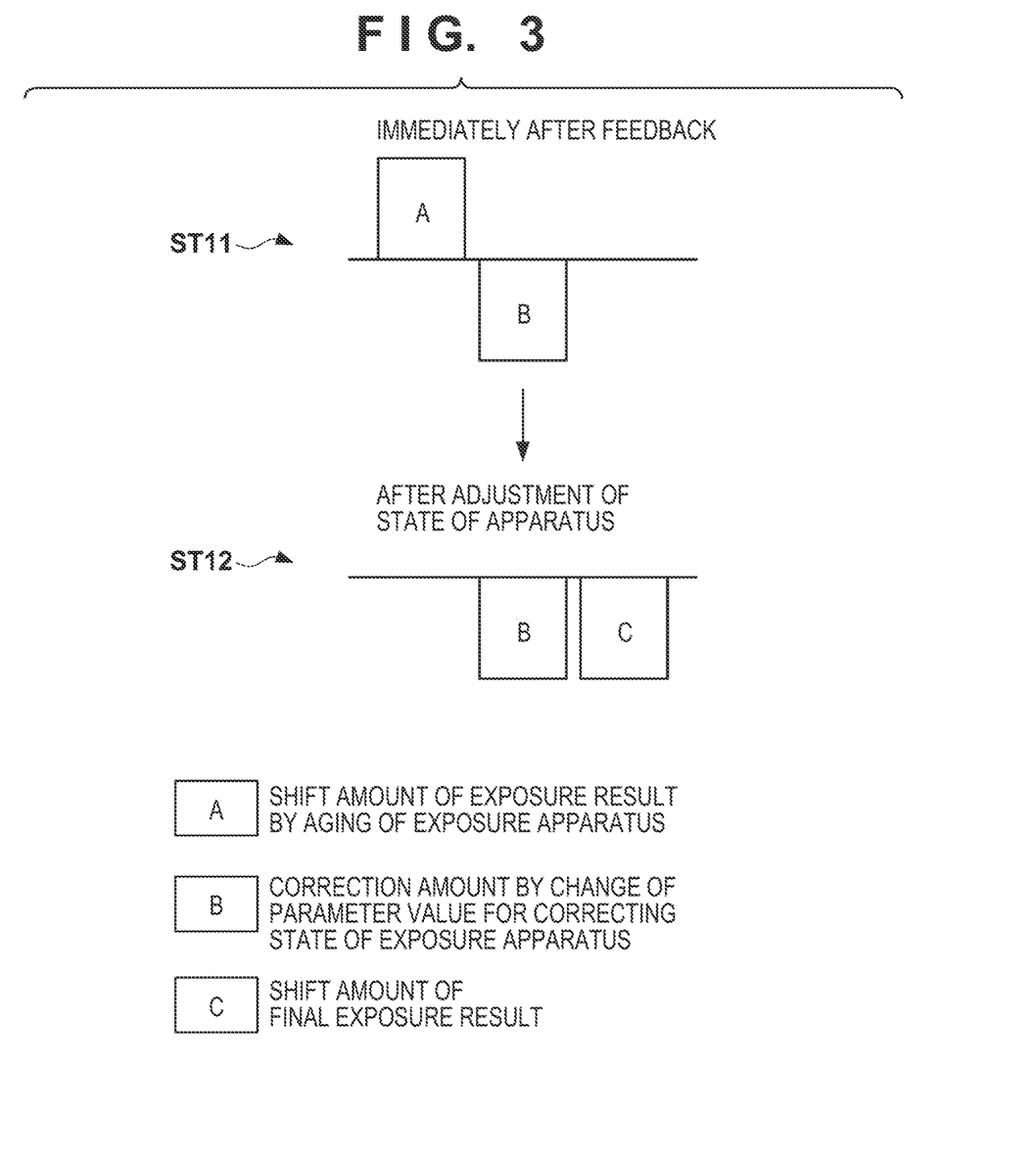
FIG. 3 is a view for explaining a problem that can be caused by adjustment of the exposure apparatus.

FIG. 3 schematically shows variance of the final shift amount C that can be generated between before and after adjustment when the exposure apparatus 1 is so adjusted as not to generate the shift amount A of the exposure result. In FIGS. 3, A, B, and C are the same as those in FIG. 2. The adjustment of the exposure apparatus 1 can be achieved by executing maintenance such as replacement of a component or executing calibration processing of a function of the exposure apparatus 1. In FIG. 3, a state ST11 represents a state of the exposure apparatus 1 before the adjustment, and a state ST12 represents a state of the exposure apparatus 1 after the adjustment.

The shift amount A of the exposure result can be cleared to, for example, 0 by executing the adjustment of the exposure apparatus 1. However, the correction amount B remains unchanged from a value set before executing the adjustment of the exposure apparatus 1. In the state ST12, the shift amount A of the exposure result has been changed (for example, cleared to 0) by executing the adjustment of the exposure apparatus 1, and the final shift amount C arises from the correction amount B. That is, the shift amount C of the final exposure result can vary abruptly between before and after the adjustment of the exposure apparatus 1. If the shift amount C of the final exposure result exceeds the allowance of the process, a product defect can be generated.

According to the management method of this embodiment, when a processing apparatus is adjusted, an offset value to control the processing apparatus can be set to reduce variance of the results of processing by the processing apparatus before and after the adjustment, in order to solve the above problem. The management method according to this embodiment will be explained with reference to FIG. 4. The management method can be controlled or executed by the controller 11 that functions as even the management apparatus.

Figure 4:
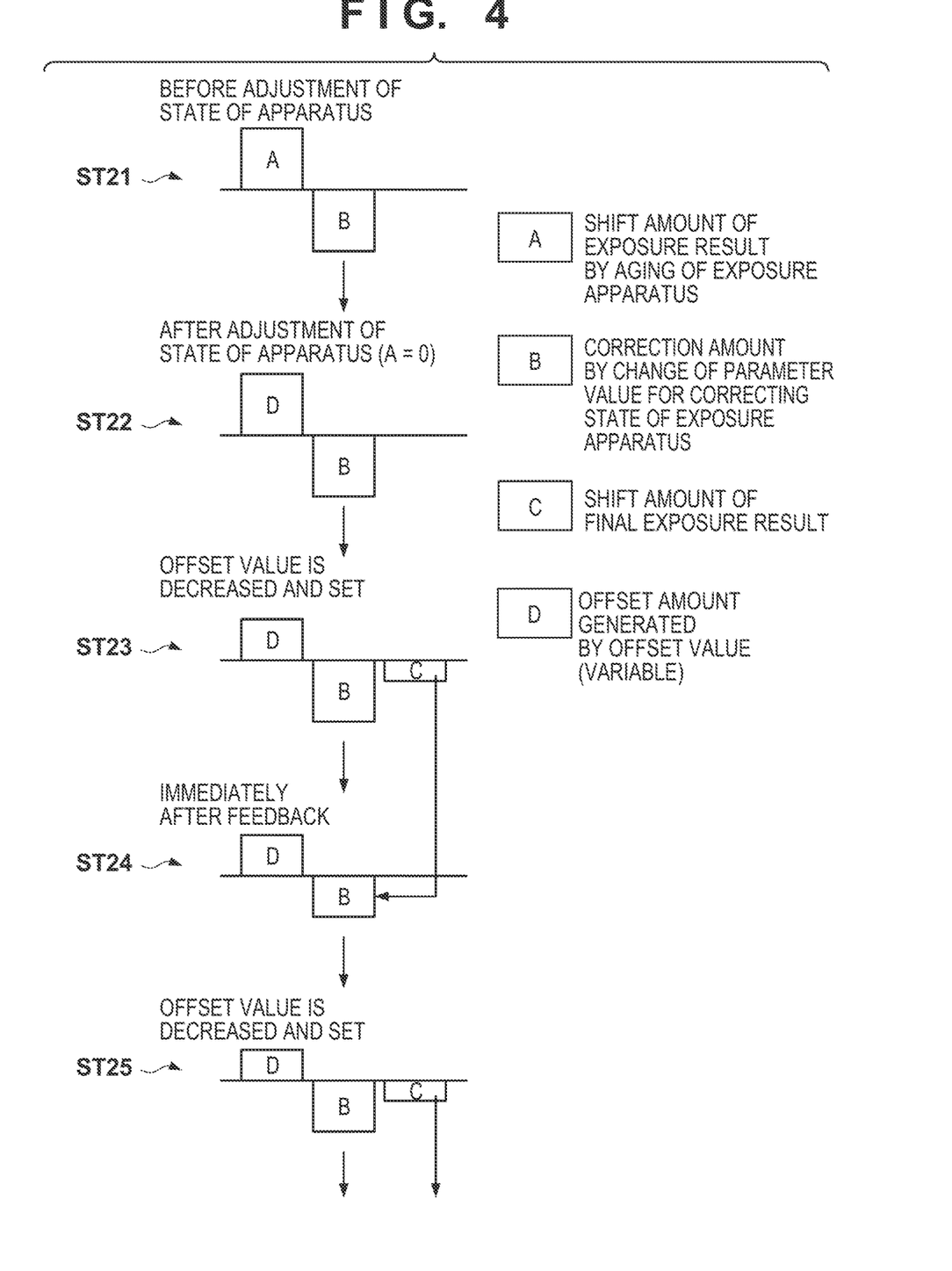
FIG. 4 is a view for explaining an exposure apparatus management method according to an embodiment of the present invention.

In FIG. 4, A, B, and C are the same as those in FIG. 2 and D schematically represents an offset amount generated by the offset value. In FIG. 4, a state ST21 represents a state before adjustment of the exposure apparatus 1. In a state ST22, the exposure apparatus 1 is adjusted to clear the shift amount A of the exposure result to 0, and an offset value is set in the exposure apparatus 1 to give the offset amount D based on the shift amount A of the exposure result before the adjustment of the exposure apparatus 1. As exemplified in the state ST22, the offset value (offset amount D) set first after the adjustment of the exposure apparatus 1 is performed can be decided to cancel all the influence of the adjustment of the exposure apparatus 1 on processing of a member by the exposure apparatus 1. This suppresses abrupt variance of the shift amount C of the final exposure result between before and after the adjustment of the exposure apparatus 1. Here, deciding an offset value is equivalent to deciding an offset amount. Also, deciding an offset amount is equivalent to deciding an offset value.

As will be described below, the controller 11 can be configured to decrease the offset value (offset amount) stepwisely after the adjustment of the exposure apparatus 1 is performed. Preferably, the controller 11 can be configured to decrease the offset value (offset amount) a plurality of times stepwisely after the adjustment of the exposure apparatus 1 is performed.

In a state ST23, the controller 11 changes, to be a smaller value, the offset value (offset amount) to control the exposure apparatus 1 in the state ST22. The state ST21 may shift to the state ST23 without going through the state ST22. In this case, the offset value (offset amount D) set first after the adjustment of the exposure apparatus 1 is performed is decided to cancel part of the influence of the adjustment of the exposure apparatus 1 on processing of a member by the exposure apparatus 1. Along with the shift from the state ST22 to the state ST23, the offset amount D changes and the shift amount C in the final exposure result can be generated in accordance with the change amount.

In a state ST24, the controller 11 sets the correction amount B to cancel the shift amount C of the final exposure result in the state ST23. In this state, the shift amount C of the final exposure result in the state ST23 is fed back to the correction amount B.

In a state ST25, the controller 11 changes, to be a smaller value, the offset value (offset amount) set in the exposure apparatus 1 in the state ST 23. In the state ST25, the shift amount C in the final exposure result can be generated in accordance with the change amount of the offset amount D. After that, the feedback as exemplified in the state ST24 and the operation of decreasing the offset value (offset amount) as exemplified in the state ST25 can be repeated. In this manner, the offset value (offset amount) can be decreased stepwisely to be 0 finally.

The update amount of the offset value (offset amount) per update and the update frequency (update timing) of the offset value (offset amount) can be decided in accordance with the process allowance, the feedback amount to the correction amount B, the frequency of feedback to the correction amount B, and the like. The update amount of the offset value (offset amount) per update and the update frequency (update timing) of the offset value (offset amount) may also be designated by control information (recipe) provided to the exposure apparatus 1 or the controller 11. The change amount of the offset value (offset amount) per change and the change frequency (update timing) of the offset value (offset amount) may also be input by the operator to a console (not shown) provided in the exposure apparatus 1. The change amount of the offset value (offset amount) per change and the change frequency (update timing) of the offset value (offset amount) can be designated by values directly representing them. The change amount of the offset value (offset amount) per change and the change frequency (update timing) of the offset value (offset amount) may also be designated by values (for example, coefficients, ratios, time constants, or statistics) indirectly representing them.

One feedback may be performed for one change of the offset value (offset amount), or a plurality of times of feedback may be performed for one change of the offset value (offset amount). As will be described later, the present invention is applicable to even a case in which no feedback is performed.

Figure 5:
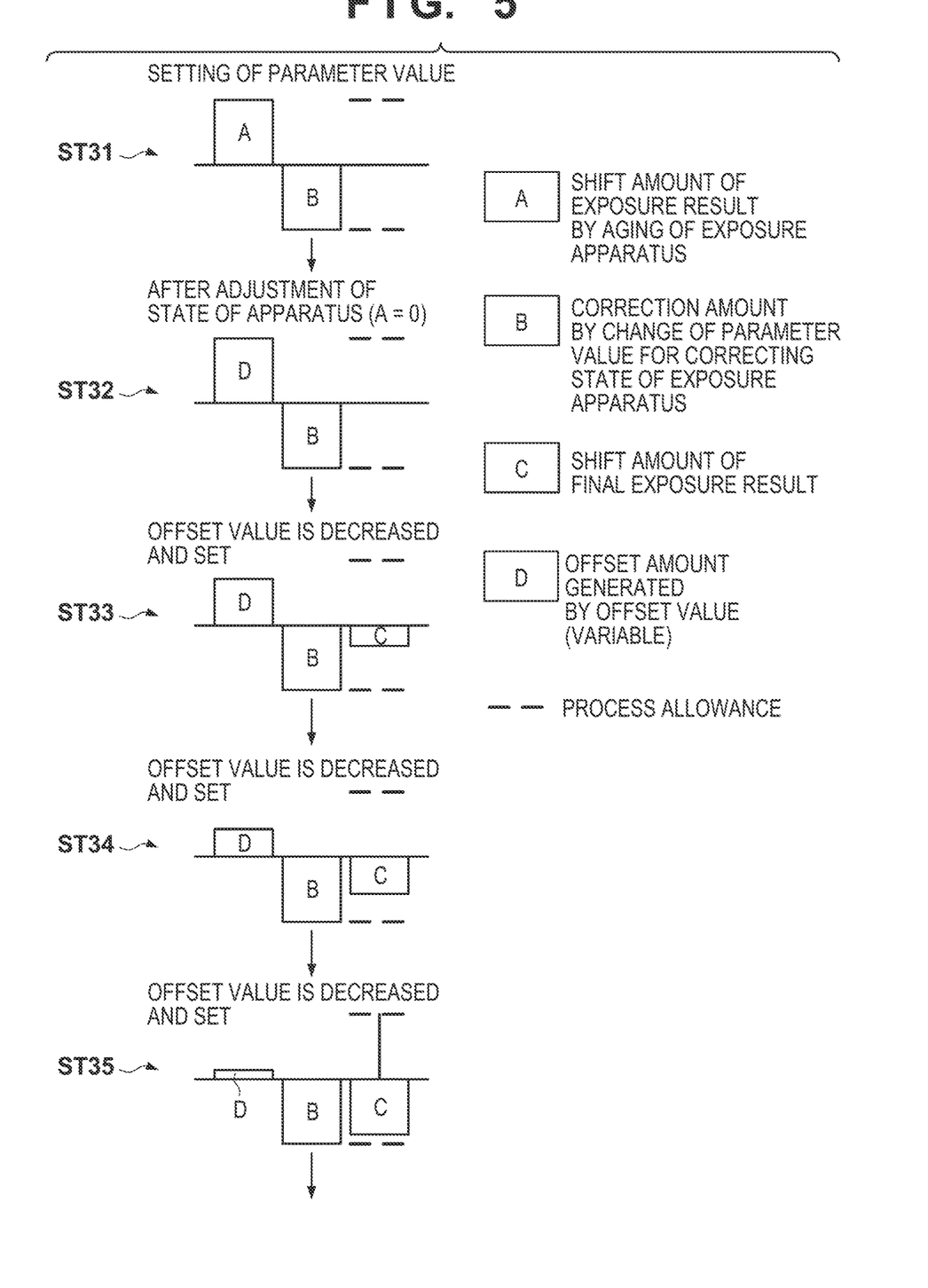
FIG. 5 is a view for explaining the exposure apparatus management method according to another embodiment of the present invention.

FIG. 5 shows an example in which the offset value (offset amount) is changed without performing feedback. In FIG. 5, A, B, and C are the same as those in FIGS. 2 and 4 and D is the same as that in FIG. 4. A dotted line schematically indicates a process allowance.

A state ST31 schematically represents a state in which a parameter value to give the correction amount B is set to cancel the shift amount A of the exposure result. In a state ST32, the exposure apparatus 1 is adjusted to clear the shift amount A, and the offset value (offset amount D) is set to cancel all the influence of the adjustment of the exposure apparatus 1 on processing of a member by the exposure apparatus 1. That is, in the state ST32, the offset value (offset amount D) is set not to change the shift amount C of the final exposure result by the adjustment of the exposure apparatus 1.

Thereafter, the controller 11 decreases the offset value (offset amount D) stepwisely, as in the states ST33 and ST34. As a result, the shift amount C of the final exposure result increases stepwisely. The controller 11 or the operator can detect in advance that the shift amount C of the final exposure result is likely to exceed the process allowance. Various measures can therefore be executed before a product defect is generated.

An example of changing the setting of the offset value along with calibration of the illuminance monitor (adjustment of the exposure apparatus) will be described below with reference to FIGS. 1 and 6 to 9. An example in which aging of the state of the exposure apparatus influences the exposure amount of a substrate will be explained.

In exposure of a substrate, optimal exposure conditions (for example, oscillation frequency, oscillation pulse count, and scanning speed) can be decided based on a set exposure amount designated by a recipe (set conditions for each process) serving as control information, and an illuminance on the substrate surface of the exposure apparatus at that time.

Examples of a method of measuring an illuminance are a method using the first illuminance monitor 21 designed to measure an illuminance in the illumination system 20, and a method using the second illuminance monitor 25 designed to measure an illuminance on the substrate stage 23. The method using the first illuminance monitor 21 does not use the original stage 22 and the substrate stage 23, so another processing can be executed on the original stage 22 and the substrate stage 23 parallel to the processing of measuring an illuminance using the first illuminance monitor 21. Hence, the method using the first illuminance monitor 21 is superior in throughput to the method using the second illuminance monitor 25. However, in the method using the first illuminance monitor 21, a change of the transmittance between the first illuminance monitor 21 and the substrate S may generate an error of the exposure amount (resultantly, a shift amount of the exposure result).

Figure 6:
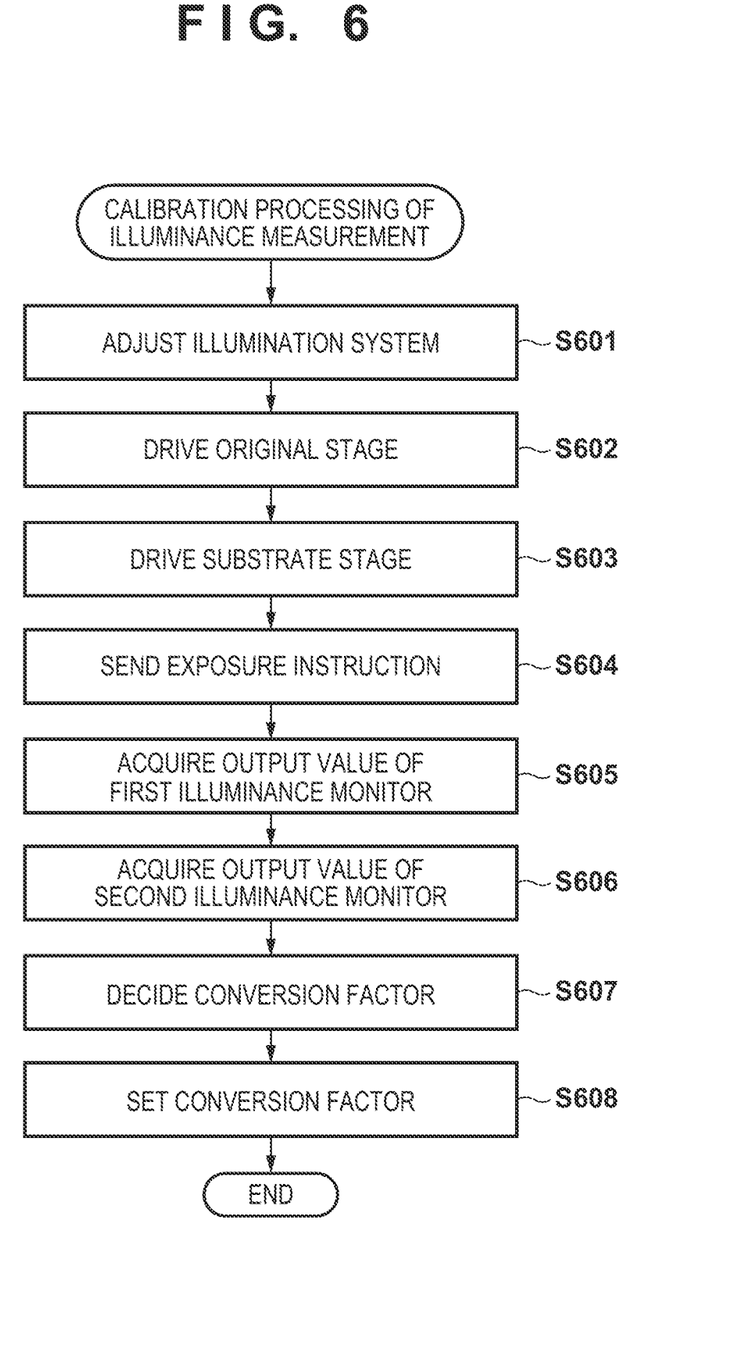
FIG. 6 is a flowchart exemplifying the flow of calibration processing of illuminance measurement.

FIG. 6 exemplifies the flow of calibration processing of illuminance measurement. The controller 11 can control calibration processing. By calibration processing, a conversion factor to convert an illuminance measured by the first illuminance monitor 21 into an illuminance on a substrate can be set.

In step S601, the controller 11 drives the illumination system 20 in accordance with an illumination mode designated by a recipe (set conditions for each process). The illumination system 20 is driven so that it can achieve illumination in the illumination mode designated by the recipe. In step S602, the controller 11 controls the driving mechanism (not shown) of the original stage 22 so as to arrange the original stage 22 at a position where light coming from the illumination system 20 is not cut off by the original stage 22. In step S603, the controller 11 controls the driving mechanism (not shown) of the substrate stage 23 so as to arrange the second illuminance monitor 25 on the substrate stage 23 in an exposure region (a region irradiated with light via the illumination system 20 and the projection system 24).

In step S604, the controller 11 sends an exposure instruction to the light source 2. In response to this, the light source 2 emits light, and the second illuminance monitor 25 on the substrate stage 23 is irradiated with light via the illumination system 20 and the projection system 24. Note that it is also possible to provide a shutter in the illumination system 20, drive it in accordance with an exposure instruction, and irradiate the substrate surface with light. The first illuminance monitor 21 is also irradiated with light split from the optical path of the illumination system 20. In step S605, the controller 11 acquires an illuminance L1 measured by the first illuminance monitor 21. In step S606, the controller 11 acquires an illuminance L2 measured by the second illuminance monitor 25.

In step S607, the controller L1 decides a conversion factor k to convert the illuminance L1 measured by the first illuminance monitor 21 into the illuminance L2 on the substrate. Here, L1, L2, and k have the relationship given by equation (1):

$$L2 = k \times L1 \tag{1}$$

In step S608, the controller 11 sets the conversion factor k. Calibration processing of illuminance measurement is processing of setting the conversion factor k. Thereafter, the illuminance L1 can be measured by only the first illuminance monitor 21, and the illuminance L2 on the substrate surface can be acquired (estimated) according to equation (1) based on the illuminance L1 measured by the first illuminance monitor 21.

Figure 7:
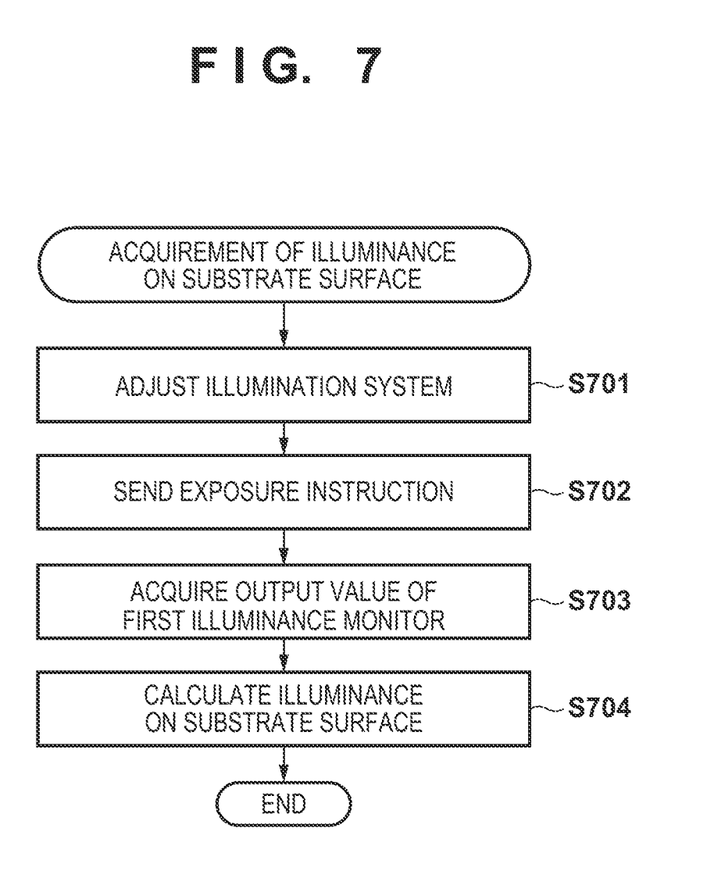
FIG. 7 is a flowchart exemplifying the procedure of processing of acquiring (estimating) an illuminance on a substrate surface using a first illuminance monitor.

FIG. 7 exemplifies the procedure of processing of acquiring (estimating) the illuminance L2 on the substrate surface using the first illuminance monitor 21. The controller 11 can control this processing. In step S701, the controller 11 drives the illumination system 20 so that illumination in an illumination mode designated by a recipe (set conditions for each process) becomes possible.

In step S702, the controller 11 sends an exposure instruction to the light source 2. In response to this, the light source 2 emits light. In step S703, the controller 11 acquires the illuminance L1 measured by the first illuminance monitor 21. In step S704, the controller 11 obtains the illuminance L2 on the substrate surface by calculation according to equation (1) based on the illuminance L1 acquired in step S703.

Figure 8A:
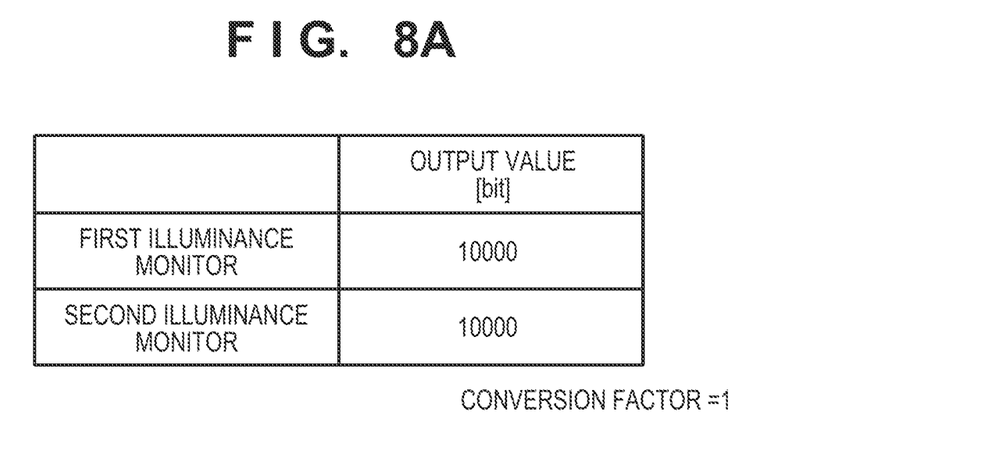
FIGS. 8A and 8B are tables exemplifying the relationship between an illuminance obtained by the first illuminance monitor and an illuminance obtained by a second illuminance monitor.
Figure 8B:
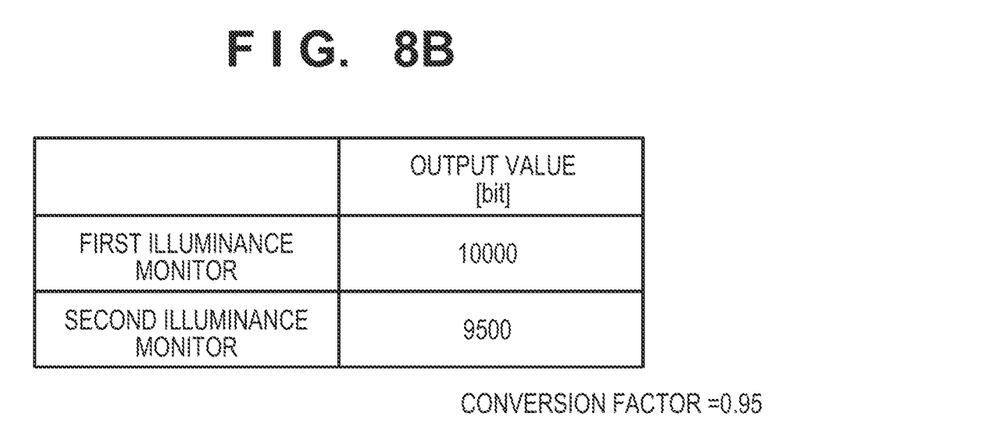

When the transmittance between the first illuminance monitor 21 and the substrate S changes (for example, the transmittance decreases due to aging or the transmittance increases due to maintenance), this change can generate an error of the exposure amount (resultantly, a shift amount of the exposure result). For example, assume that the illuminances L1 and L2 respectively measured by the first illuminance monitor 21 and the second illuminance monitor 25 at the time of finally executing calibration processing is a result shown in FIG. 8A. Also, assume that results shown in FIG. 8B are obtained if the first illuminance monitor 21 and the second illuminance monitor 25 measure illuminances at arbitrary timings after final calibration processing. In the state of FIG. 8B, an exposure amount shift of 5% is generated unless calibration processing is executed.

Figure 9:
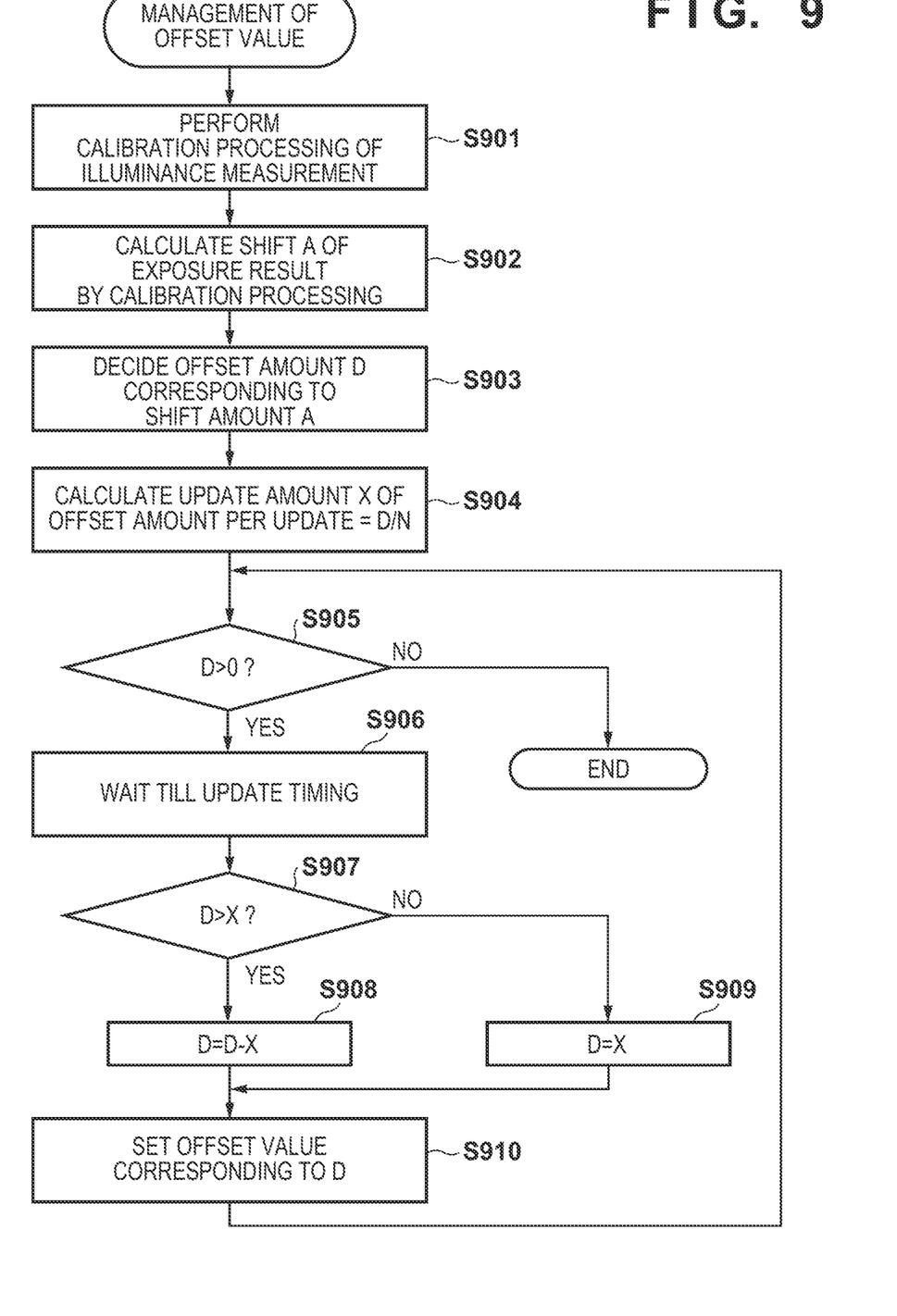
FIG. 9 is a flowchart exemplifying the procedure of offset value management processing accompanying adjustment (calibration processing) of the exposure apparatus.

FIG. 9 exemplifies the procedure of offset value management processing accompanying calibration processing. The controller 11 can execute the management processing. Assume that the state of the exposure apparatus 1 before executing the management processing in FIG. 9 is the state ST21 in FIG. 4.

In step S901, the controller 11 executes calibration processing shown in FIG. 7. Execution of calibration processing is an example of adjustment of the exposure apparatus. By calibration processing, the state of the exposure apparatus 1 can change so as to influence an exposure result (for example, a line width).

In step S902, the controller 11 acquires by calculation the shift amount A of the result (for example, the line width) of exposure by the exposure apparatus 1 that is generated by executing calibration processing in step S901. For example, when the conversion factor k changes from 1 to 0.95 by calibration processing, the shift amount A corresponding to the change amount (5%) can be generated. The relationship between the change amount of the conversion factor k and the shift amount A can be acquired in advance through an experiment or the like and incorporated as a table or a calculating formula in the controller 11.

In step S903, the controller 11 decides the offset amount D corresponding to the shift amount A (for example, the offset amount D equal to the shift amount A) based on the shift amount A of the exposure result acquired in step S602.

In step S904, the controller 11 decides an update amount X of the offset amount per update by calculation or the like. The update amount X of the offset amount per update can be decided by dividing the offset amount D corresponding to the shift amount A by an update count N, that is, according to equation (2):

$$X = D/N \tag{2}$$

In steps S905 to S910, the controller 11 decreases a plurality of times stepwise the offset amount D (offset value) to control the exposure apparatus 1. In the processing of steps S905 to S910, the offset amount D is rewritten (into a smaller value) in step S908 or S909. First, in step S905, the controller 11 determines whether the (remaining) offset amount D is larger than 0. If the (remaining) offset amount D is larger than 0, the process advances to step S906; if the (remaining) offset amount D is 0, the management processing in FIG. 9 ends.

In step S906, the controller 11 waits till the update timing. In step S907 after step S906, the controller 11 determines whether the (remaining) offset amount D is larger than the update amount X. If the (remaining) offset amount D is larger than the update amount X, the process advances to step S908; otherwise, to step S909. In step S908, the controller 11 rewrites the value of the offset amount D into a D-X value. In step S909, the controller 11 rewrites the value of the offset amount D into an X value. In step S910, the controller 11 sets an offset value corresponding to the (remaining) offset amount D. After that, the process returns to step S905 to repeat the processing of steps S905 to S910.

The offset value can be a value set for, for example, a parameter (for example, oscillation frequency, oscillation pulse count, or scanning speed (in the case of a scanning exposure apparatus)) that influences an exposure result. The relationship between the offset value and the exposure result (for example, the line width) can be acquired in advance through experiment or the like and incorporated as a table or a calculating formula in the controller 11.

Note that when adjustment of the exposure apparatus is executed during execution of management processing shown in FIG. 9, the shift amount A of the exposure result that is generated by the adjustment can be calculated to execute processing of steps S903 to S910.

Management processing exemplified in FIG. 9 suppresses abrupt variance of the shift amount C of the final exposure result between before and after execution of calibration processing serving as an example of adjustment of the exposure apparatus 1.

In the above-described example, the shift amount C of the final exposure result in a state (for example, the state ST21) in which the exposure apparatus is optimally adjusted is assumed to be 0. However, in practice, the shift amount C of the final exposure result may not become 0 owing to an adjustment error or the like. In this case, letting E be the shift amount of the exposure result that is generated by an adjustment error or the like, the shift amount C of the final exposure result becomes 0 by setting the correction amount B=A+E. At the time of adjustment of the exposure apparatus, the shift amount A is set to be 0 and the offset amount D=the shift amount A is set. Thereafter, the offset amount D is changed to gradually come close to 0, the correction amount B finally becomes equal to E, and the shift amount C of the final exposure result becomes 0. In this way, the present invention can be applied to even a case in which the shift amount of the exposure result is not 0 when the exposure apparatus is optimally adjusted.

If adjustment accompanied by replacement of a component of the exposure apparatus 1 is executed, the shift amount A generated by aging of the exposure apparatus before the replacement of the component cannot be obtained. In this case, the shift amount A generated by aging of the exposure apparatus is measured before the replacement of the component, and the offset amount D (offset value) is decided based on the shift amount. After the replacement of the component, the offset amount D (offset value) is so given as to decrease stepwisely. In other words, the offset amount D (offset value) can be set based on the state of the exposure apparatus 1 before the replacement of the component and the state of the exposure apparatus 1 after the replacement of the component.

The above-described example regards a case in which aging occurs in a state of the exposure apparatus that influences the exposure amount. However, the present invention is applicable to even a case in which aging occurs in a state of the exposure apparatus that influences the alignment or the focus. The focus sensors 26 can be used for measurement of a state of the exposure apparatus that influences the focus. The alignment sensor 27 can be used for measurement of an adjustment state of the exposure apparatus that influences the alignment. The present invention is applicable to either case as long as the shift amount of the exposure result due to aging of the exposure apparatus can be measured.

An article manufacturing method of manufacturing an article using the pattern forming apparatus (processing apparatus) typified by the exposure apparatus 1 will be described below. This article manufacturing method includes a step of managing the pattern forming apparatus according to the above-described management method, a step of forming a pattern on a member using the pattern forming apparatus, and a step of processing the member on which the pattern has been formed. An article is manufactured from this member. The step of forming a pattern on a member can further include, for example, a step of forming a photoresist film on the member, a step of exposing the photoresist film by the exposure apparatus, and a step of developing the photoresist film to form a pattern.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-226035, filed Nov. 24, 2017, which is hereby incorporated by reference herein in its entirety.

What is claimed is:

1. A management method of managing a processing apparatus that performs processing of a member, comprising:

performing adjustment of the processing apparatus;

obtaining a shift amount of processing result provided by the processing apparatus, the shift amount being caused by the adjustment;

deciding, based on the obtained shift amount, an offset value to control the processing apparatus so as to cancel either of all or part of influence that the adjustment of the processing apparatus exerts on the processing of a member;

setting the decided offset value to the processing apparatus;

performing the processing of a member by the processing apparatus to which the offset value has been set;

decreasing the offset value which has been set to the processing apparatus by subtracting an update amount which is determined by the offset value from the offset value; and then performing the processing of a member by the processing apparatus in a state that the decreased offset value is set to the processing apparatus.

2. The method of claim 1, wherein the decreasing the offset value and the performing the processing of a member which follows the decreasing the offset value are performed until the offset value is less than or equal to a predetermined value.

3. The method according to claim 1, wherein the decreasing the offset value and the performing the processing of a member which follows the decreasing the offset value are performed a plurality of times so that the offset value is deceased stepwisely.

4. The method of claim 1, wherein the processing of the member includes at least one of exposure processing, imprinting processing and deposition processing.

5. The method according to claim 1, wherein the adjustment includes calibration of a function of the processing apparatus.

6. The method according to claim 1, wherein the adjustment includes maintenance of the processing apparatus.

7. The method according to claim 6, wherein the maintenance includes replacement of a component of the processing apparatus.

8. The method according to claim 7, wherein the offset value is set based on a state of the processing apparatus before the replacement and a state of the processing apparatus after the replacement.

9. The method according to claim 1, wherein a result of the processing by the processing apparatus is fed back in accordance with a change of the offset value to a parameter value for controlling the processing apparatus.

10. The method according to claim 1, wherein the processing apparatus includes a pattern forming apparatus that forms a pattern on a member.

11. The method according to claim 10, wherein the pattern forming apparatus is an exposure apparatus.

12. An article manufacturing method comprising:

managing a pattern forming apparatus for forming a pattern;

processing a member on which the pattern has been formed by the pattern forming apparatus, wherein an article is manufactured from the member, wherein the managing the pattern forming apparatus comprising:

wherein the managing the pattern forming apparatus comprising:

performing adjustment of the pattern forming apparatus;

obtaining a shift amount of processing result provided by the pattern forming apparatus, the shift amount being caused by the adjustment;

deciding, based on the obtained shift amount, an offset value to control the pattern forming apparatus so as to cancel either of all or part of influence that the adjustment of the pattern forming apparatus exerts on the processing of a member;

setting the decided offset value to the pattern forming apparatus;

performing processing for forming a pattern by the pattern forming apparatus to which the offset value has been set;

decreasing the offset value which has been set to the pattern forming apparatus by subtracting an update amount which is determined by the offset value from the offset value; and then performing the processing for forming a pattern by the pattern forming apparatus in a state that the decreased offset value is set to the pattern forming apparatus.

13. A management apparatus that manages a processing apparatus designed to perform processing of a member, comprising:

a controller configured to:

cause the processing apparatus to perform adjustment of the processing apparatus;

obtain a shift amount of processing result provided by the processing apparatus, the shift amount being caused by the adjustment;

decide, based on the obtained shift amount, an offset value to control the processing apparatus so as to cancel either of all or part of influence that the adjustment of the processing apparatus exerts on the processing of a member;

set the offset value to the processing apparatus;

cause the processing apparatus to perform processing a member;

decrease the offset value which has been set to the processing by subtracting an update amount which is determined by the offset value from the offset value; and then cause the processing apparatus to perform processing a member in a state that the decreased offset value is set to the processing apparatus.

14. The apparatus according to claim 13, wherein the controller feeds back a result of the processing by the processing apparatus to a parameter value for controlling the processing apparatus.

15. The apparatus according to claim 13, the decreasing the offset value and the causing the processing apparatus to perform the processing which follows the decreasing the offset value are performed a plurality of times so that the offset value is deceased stepwisely.

16. The apparatus according to claim 13, wherein the adjustment includes at least one of calibration of a function of the processing apparatus, or maintenance of the processing apparatus, and/or replacement of a component of the processing apparatus.

17. The apparatus according to claim 16, wherein the controller sets the offset value based on a state of the processing apparatus before the replacement and a state of the processing apparatus after the replacement.

18. A management apparatus that manages an exposure apparatus designed to perform processing of a member, comprising:

a controller configured to:

cause the exposure apparatus to perform a calibration process of the exposure apparatus;

obtain a shift amount of an exposure result caused by the calibration process;

decide, based on the obtained shift amount of the exposure result, an offset amount so as to cancel either of all or part of influence that the calibration process of the exposure apparatus exerts on the processing of a member;

set the decided offset value to the exposure apparatus;

cause the exposure apparatus to perform processing a member;

decrease the offset value which has been set to the exposure apparatus; and then cause the exposure apparatus to perform processing of a member in a state that the decreased offset value is set to the exposure apparatus.

19. A management method of managing an exposure apparatus that performs processing of a member, comprising:

performing a calibration process of the exposure apparatus;

obtaining a shift amount of an exposure result caused by the calibration process;

deciding, based on the obtained shift amount of the exposure result, an offset value to control the exposure apparatus so as to cancel either of all or part of influence that the calibration process of the exposure apparatus exerts on the processing of a member;

setting the decided offset value to the exposure apparatus;

performing the processing of a member by the exposure apparatus;

decreasing the offset value which has been set to the exposure apparatus; and then performing the processing of a member by the exposure apparatus in a state that the decreased offset value is set to the exposure apparatus.

20. A non-transitory computer readable medium storing a program which operates a computer to execute a management method, the method comprising:

causing the processing apparatus to perform adjustment of the processing apparatus;

obtaining a shift amount of processing result provided by the processing apparatus, the shift amount being caused by the adjustment;

deciding, based on the obtained shift amount, an offset value to control the processing apparatus so as to cancel either of all or part of influence that the adjustment of the processing apparatus exerts on the processing of a member;

setting the offset value to the processing apparatus;

causing the processing apparatus to perform processing a member;

decreasing the offset value which has been set to the processing apparatus by subtracting an update amount which is determined by the offset value from the offset value; and then causing the processing apparatus to perform processing a member in a state that the decreased offset value is set to the processing apparatus.

* * * * *